United States Patent
Vergöhl et al.

(10) Patent No.: US 12,428,720 B2
(45) Date of Patent: Sep. 30, 2025

(54) METHOD FOR PRODUCING LAYERS WITH IMPROVED UNIFORMITY IN COATING SYSTEMS WITH HORIZONTALLY ROTATING SUBSTRATE GUIDING

(71) Applicant: FRAUNHOFER-GESELLSCHAFT ZUR FÖRDERUNG DER ANGEWANDTEN FORSCHUNG E.V., Munich (DE)

(72) Inventors: Michael Vergöhl, Braunschweig (DE); Andreas Pflug, Braunschweig (DE); Stefan Bruns, Braunschweig (DE); Tobias Zickenrott, Braunschweig (DE)

(73) Assignee: Fraunhofer-Gesellschaft zur förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 17/267,106

(22) PCT Filed: Aug. 9, 2019

(86) PCT No.: PCT/EP2019/071460
§ 371 (c)(1),
(2) Date: Feb. 9, 2021

(87) PCT Pub. No.: WO2020/030794
PCT Pub. Date: Feb. 13, 2020

(65) Prior Publication Data
US 2021/0164092 A1     Jun. 3, 2021

(30) Foreign Application Priority Data
Aug. 10, 2018   (DE) ............... 10 2018 213 534.7

(51) Int. Cl.
C23C 14/35 (2006.01)
C23C 14/04 (2006.01)
(Continued)

(52) U.S. Cl.
CPC .......... *C23C 14/352* (2013.01); *C23C 14/044* (2013.01); *C23C 14/3485* (2013.01); *C23C 14/505* (2013.01); *C23C 14/547* (2013.01)

(58) Field of Classification Search
CPC ..... C23C 14/50; C23C 14/352; C23C 14/044; C23C 14/3485; C23C 14/505; C23C 14/547
See application file for complete search history.

(56) References Cited

U.S. PATENT DOCUMENTS

| 4,851,095 A | 7/1989 | Scobey et al. |
| 5,415,754 A | 5/1995 | Manley |

(Continued)

FOREIGN PATENT DOCUMENTS

| CN | 101652499 A | 2/2010 |
| DE | 19827587 A1 | 12/1999 |

(Continued)

OTHER PUBLICATIONS

Siemers et al., "Particle-in-cell Monte Carlo Analysis of Anomalous Target Erosion in Magnetron Sputtering," *51st Annual Technical Conference Proceedings*, Chicago, IL, Apr. 19-24, 2008, pp. 43-48.

(Continued)

*Primary Examiner* — John J Brayton
(74) *Attorney, Agent, or Firm* — Leydig, Voit & Mayer, Ltd.

(57) ABSTRACT

The invention relates to a method for producing layers with very good uniformity in coating systems with horizontally rotating substrate guiding. Alternatively, certain layer thickness gradients can be set. The particle loading is also significantly reduced. The service life is much higher compared to other methods. Parasitic coatings are reduced. The coating rate is also increased.

10 Claims, 8 Drawing Sheets

(51) Int. Cl.
  *C23C 14/34* (2006.01)
  *C23C 14/50* (2006.01)
  *C23C 14/54* (2006.01)

(56) References Cited

U.S. PATENT DOCUMENTS

| | | | |
|---|---|---|---|
| 5,609,772 | A | 3/1997 | Daubenspeck et al. |
| 8,574,409 | B2 | 11/2013 | Kadlec et al. |
| 8,956,511 | B2 | 2/2015 | Scherer et al. |
| 9,349,576 | B2 | 5/2016 | Bernick et al. |
| 9,803,276 | B2 * | 10/2017 | Vergöhl ............... C23C 14/564 |
| 2003/0042130 | A1 | 3/2003 | Krassnitzer |
| 2003/0129407 | A1 * | 7/2003 | Teer .................. C23C 14/0605 428/408 |
| 2005/0061666 | A1 | 3/2005 | Gupta et al. |
| 2007/0227882 | A1 | 10/2007 | Trassl et al. |
| 2010/0181191 | A1 | 7/2010 | Tamagaki |
| 2011/0127157 | A1 * | 6/2011 | Bellido-Gonzalez ........................ H01J 37/3405 204/192.12 |
| 2011/0253529 | A1 | 10/2011 | Ockenfuss |
| 2012/0138452 | A1 * | 6/2012 | Anders ............... H01J 37/3497 204/298.03 |
| 2013/0032475 | A1 | 2/2013 | Huhn et al. |
| 2014/0262752 | A1 | 9/2014 | Vergöhl et al. |
| 2016/0254127 | A1 | 9/2016 | Vergöhl et al. |
| 2017/0342547 | A1 | 11/2017 | Choi et al. |
| 2017/0371224 | A1 | 12/2017 | Seeboth et al. |

FOREIGN PATENT DOCUMENTS

| | | |
|---|---|---|
| DE | 103 475 21 A1 | 6/2004 |
| DE | 10 2013 207771 A1 | 10/2014 |
| DE | 10 2013 208771 A1 | 11/2014 |
| DE | 10 2013 221029 A1 | 4/2015 |
| EP | 2 549 521 A1 | 1/2013 |
| EP | 2 811 508 A1 | 12/2014 |
| EP | 2 811 509 A1 | 12/2014 |
| JP | H04-358064 A | 12/1992 |
| JP | 2009-024230 A | 2/2009 |
| JP | 2014-520966 A | 8/2014 |
| WO | WO-03018862 A2 * | 3/2003 ............ C23C 14/06 |
| WO | WO 2005/050696 A1 | 6/2005 |

OTHER PUBLICATIONS

Arnell et al., "Recent advances in magnetron sputtering," *Surface and Coating Technology* 112(1-3): 170-176 (1999) Abstract only.
Vergöhl et al., "Progress on Optical Coatings Deposited with Dual Rotatable Magnetrons in a Sputter Up System," *Surface and Coatings Technology* 241: 38-44 (2013).
European Patent Office, International Search Report in International Application No. PCT/EP2019/071460 (Nov. 13, 2019).
European Patent Office, Written Opinion in International Application No. PCT/EP2019/071460 (Nov. 13, 2019).
International Bureau of WIPO, International Preliminary Report on Patentability in International Application No. PCT/EP2019/071460 (Feb. 16, 2021).
U.S. Appl. No. 14/234,019, filed Jan. 21, 2014.
U.S. Appl. No. 15/029,536, filed Apr. 14, 2016.
U.S. Appl. No. 15/540,097, filed Jun. 27, 2017.
Japan Patent Office, Notice of Reasons for Refusal in Japanese Patent Application No. 2021-507037 (Apr. 19, 2022).
Veselov et al., "Formation of dielectric silicon compounds by reactive magnetron sputtering," *Journal of Physics: Conference Series*, vol. 747, II Conference on Plasma & Laser Research and Technologies, Jan. 25-27, 2016, Moscow, Russia (6 pgs.).
Yang "Study on the Distribution of Magnetic Field and Thin Film Thickness Uniformity of Magnetron Sputtering System," Chinese Master's Theses Full-text Database, *Engineering Science and Technology II* (2011) 71 pgs.
Japan Patent Office, Notice of Reasons for Refusal in Japanese Patent Application No. 2021-507037 (Oct. 18, 2022).
China National Intellectual Property Agency, First Office Action in Chinese Patent Application No. 2019800529660 (Oct. 11, 2022).

* cited by examiner

Configuration: Even

Configuration: Odd

METHOD FOR PRODUCING LAYERS WITH IMPROVED UNIFORMITY IN COATING SYSTEMS WITH HORIZONTALLY ROTATING SUBSTRATE GUIDING

CROSS-REFERENCE TO RELATED APPLICATIONS

This patent application is the U.S. national phase of International Application No. PCT/EP2019/071460, filed on Aug. 9, 2019, which claims the benefit of German Patent Application No. 10 2018 213 534.7, filed Aug. 10, 2018, the disclosures of which are incorporated herein by reference in their entireties for all purposes.

The invention relates to a device and to a method for producing layers having very good uniformity on coating systems with a horizontally rotating substrate guidance. Alternatively, specific layer thickness gradients can be set. The particle load is additionally considerably reduced. The service life is considerably increased with respect to other processes. Parasitic coatings are reduced. The coating rate is also increased.

Optical layers today frequently comprise a sequence of low refraction and high refraction layers in which therefore specific materials are stacked above one another. The layer thicknesses can amount to between a few nm and several μm depending on the function and the wavelength range. Materials are, for example, $SiO_2$, $Ta_2O_5$, $Nb_2O_5$, $HfO_2$, $ZrO_2$, $TiO_2$. Amorphous Si materials containing hydrogen (a-Si:H) are also used.

A desired layer function is achieved by the suitable stacking of the layer sequence above one another. It can, for example, be a bandpass filter or an edge filter. Coatings to control the phase position of the reflected or transmitted light are also possible.

The spectral location of the edge or of the bandpass is decisive for the function of the coating. There is therefore great interest in achieving uniform layers on the coating material. In other applications, layers are also required in which a specific layer profile is desired. This is the case for bandpass filters in which the central wavelength depends on the position (gradient filters). Such gradient filters are used, for example, on photosensitive sensors in image processing. They often have a size of a few 10 mm and are sensitive in a range from approximately 190 to approximately 1100 nm. A bandpass filter having a corresponding central wavelength would therefore only require approximately ⅙ of the layer thickness with light at 190 nm than at 1100 nm with a 30 mm long sensor. As the sensor surface becomes smaller, the layer thickness gradient would further increase so that steeper gradients have to be implemented.

A specific layer thickness distribution is also often required on 3D components such as lenses. This can require a lateral gradient having a specific shape.

As a rule, a plurality of layers are stacked above one another. Filter coatings are then produced having a layer number of less than 4 μm and more than 100 μm, frequently having thicknesses of less than 1 μm and more than 10 μm or even several 10 μm.

A further demand is also to introduce as few defects as possible into the layer. They can, for example, be caused by flaking of chamber walls or elements that are located in the region of the coating.

These "parasitic" coatings are formed since the coating source has a relatively wide distribution of the dusted coating material into the room. A large portion of the coating therefore moves onto the chamber walls or onto components that are arranged directly in front of the substrates for a rate correction instead of onto the substrates. If the coating is too thick in these regions or if thermal loads arise, particles can be released from these coatings or also the total parasitic coating can be released. Particles can, however, also be produced directly on the sputtering sources.

Many attempts have been made to reduce the particle load. This will be described in the following.

It was simultaneously attempted to develop production processes that can produce very uniform layers. Alternatively, layers can also be manufactured with a defined gradient in the layer thickness.

The manufacture of low particle optical layers can take place using a magnetron sputtering device such as is known from U.S. Pat. No. 9,803,276 B2.

The manufacture of low particle coatings is presented in this document, with the cleanliness of the coating being achieved by the use of cylindrical source material (rotatable magnetrons), optionally together with a reactive gas component, applied to the substrate by magnetron sputtering. The application of the layer takes place against gravity in a so-called "sputter-up" process. Since a substrate subrotation (satellite movement) is not provided, a layer thickness profile is produced on the substrate that increases inversely proportionally to the radius to the center of rotation. In an arrangement, for example, in which the substrate center has moved 600 nm from the center of rotation and the substrate has a diameter of 200 mm, only approximately 70% of the layer rate would arrive at the outside with respect to the rate at the inside.

The setting of the layer uniformity therefore takes place using masks that locally restrict the coating flow. The mask is disposed between the source and the substrate; as a rule here closely to the substrate to be able to set the layer distribution as exactly as possible. The mask is thus disposed directly in the coating region. Since unlike moved substrates the mask is usually attached statically, it receives a large amount of material. In the above-described geometry with a substrate center of 600 mm distant from the center, a correction aperture has a rate approximately 5-10 times as large as the substrates themselves. If therefore 10 μm of layer material is deposited on the substrate, the screen already receives 100 μm. The material supply is very large in particular with cylindrical sputtering sources so that in principle a service life of a plurality of months would be possible. If these targets, for example, have a service life of 8000 hours, a service life of 70 days (24 hours a day, 7 days a week) would be possible at the power of 5 kW. A layer thickness of 480 μm could thus be deposited on the substrate before the target has to be replaced. If the second material is included, the layer thickness would accumulate to 10 mm on the uniformity screens. It is, however, favorable not to exceed a specific thickness of approximately 1 mm on the uniformity screens.

If the thickness on the screen is too large, flaking and particle formation can occur so that systems have to be cleaned beforehand as a rule, with the screens being cleaned or even replaced. The service life of the system is thus also limited after a cleaning.

This is in particular of particular disadvantage in current systems that work with cylindrical sputtering sources because the sputtering sources themselves have a multiple service life in comparison with conventional linear magnetrons. The production time could be considerably extended without an intermediate cleaning if it proves possible to reduce the parasitic coating on the uniformity screens.

Another method of depositing high quality optical coatings is described in U.S. Pat. No. 8,956,511 B2.

A turntable arrangement is provided there in which the substrates rotate on a plate and a very thin partial layer of a few 0.1 nm is deposited on every passage. Oxygen is added at the location of the magnetron so that a hypostoichiometric layer is first deposited. This layer is oxidized using a subsequent plasma source. The setting of the layer thickness distribution takes place by means of so-called "correction masks" that take away a larger coating portion in the inner region than in the outer region. If the magnetrons are not substantially longer in comparison with the substrate diameter, the screens are even of bone shape because the layer profile of the magnetron is highly variable toward the ends.

A likewise frequently used method is the user of a satellite rotation of the substrates. The substrates are located on a rotating plate and rotate about themselves in so doing. Annular sputtering sources are used here.

A method is known from U.S. Pat. No. 8,574,409 in which a set of magnets rotates with an annular magnetron and the power is periodically modulated here at a specific frequency to improve the uniformity of the layer distribution.

A device for an annularly closed target is described in U.S. Pat. No. 5,609,772 A in which the magnetic field lines on the target can be displaced by an additional magnetic field produced by exciting current. The profile of the target erosion can thus be displaced and the distribution of the rate can be influenced, for example.

A sputtering arrangement without masks is described in US 2011/253529. A high uniformity is achieved there in that a specific dimensioning of an annular magnetron source having a specific diameter is proposed. The center of the magnetron cathode is central to the rotating substrate centers. A planetary drive is, however, provided there so that two rotations are superposed.

Different kinds of magnetron sources are used in sputtering systems.

A so-called drum geometry is described in U.S. Pat. No. 4,851,095. Here, the sources are typically located as a linear source at the side walls of a chamber. The substrates are located inwardly on a rotating drum.

In a variant, layer distributions on the substrate can be influenced by varying the distance of individual magnets from the target surface along the target axis. Individual magnets are set back in this process. This method is called "UniTune" and makes possible a distribution to +/−1% without shapers. The setting is thus possible within very tight limits (a few %).

This method would not be suitable for the proposed arrangement with a turntable since it would have the consequence of a very high attenuation of the magnetic field so that the impedance and thus the voltage of the process would increase greatly. In addition, a very much higher change of the rate by approximately 30% is needed for the present method.

A similar method is proposed in US 2003/0042130. "Electron traps" are introduced there with the aid of an additional magnetic field at the target by which the plasma density and thus the sputtering yield along the target can be influenced.

The variation of the geometry of magnets to control the layer distribution is also described for cylindrical magnetron sources in US 2013/0032475. Either the distance between the target and the substrate can be varied or also the rotational angle of the whole set of magnets ("swing cathodes").

A specific magnet system for cylindrical magnetrons is described in U.S. Pat. No. 9,349,576. The magnets have a specific shape there and the magnetron can be used as a retrofit for planar magnetrons.

In R. D. Arnell et al., "Recent advances in magnetron sputtering", Surf. Coat. Technol. 112 (1999), p. 170, the method of "closed field unbalanced magnetron sputtering" is described. It reports on the magnetron configuration of dual magnetron arrangements.

Magnetron arrangements can be both unbalanced and balanced. Unbalanced arrangements are spoken of when e.g., the outer magnet ring has a higher field strength than the inner ring. Some electrons are thereby no longer held at the target, but rather follow the magnetic field lines in the direction toward the substrate. The plasma expands further toward the substrate and a better compaction of the layer can take place, for example. It can, however, also be disadvantageous that more particles are carried into the layer. With a balanced arrangement, in contrast, the plasma is held more at the target.

Arnell et al. also propose a closed field arrangement with dual magnetrons in which magnetrons disposed next to one another have opposite polarity (dual co-planar closed field arrangement). A better plasma density and the possibility of manufacturing better materials are considered advantages of this arrangement. Working in a closed field arrangement is proposed there. A plurality of magnetron sources are required on the chamber for this purpose. The polarity of the magnets does not take place in the same manner for all the sources here, but rather in each case opposite to the adjacent cathode. While one cathode therefore has a polarity N-S-N, the cathode disposed next to it has a polarity S-N-S. This has the result that the plasma is guided more from one cathode to the next and is closed more (closed field). However, the lateral distribution of the layer along the target axis is not considered there. The closed field arrangement should serve to produce denser layers having better properties.

The magnetrons can be linear sources, round sources, or also cylindrical sources. They can be operated by means of DC current or AC current in the mid frequency range (10-20 kHz). Radio frequencies (RF, typically 13.56 MHz are also used with insulating sputtering materials. The sources can be unipolar (sputtering source as the cathode, the respective positive pole designed as a separate anode) or as bipolar.

An approach is described in US 2016/0254127 A1 in which the layer thickness distribution is influenced by two magnetrons. The approach is based on a rotation of the magnets that effect a (de)coupling of the magnetic fields. A tilting of the distribution can thus be made possible for the case of a turntable arrangement. However, this approach is only suitable for small changes in the distribution and furthermore requires the use of masks.

U.S. Pat. No. 8,574,409 describes a system in which a power modulation is used in an annular magnetron in dependence on the rotation of a set of magnets.

Magnets are known from US 2005/0061666 A1 that are moved by planar magnets in operation ("sweeping") so that a higher target utilization results.

Frequently, so-called shunts are used to influence the magnetic field in magnetrons (U.S. Pat. No. 5,415,754). The shunts are ferromagnetic plates that are placed below the targets between the magnet rows. The field lines thus run flatter at the target between the racetracks. It is in contrast disadvantageous that with bipolar processes a magnetic barrier is set up for the electrons between the targets. As a rule the impedance and thus also the discharge voltage of the generator thus increase. This is unfavorable because a high voltage can result in increased particle formation.

3D effects often occur with magnetron discharges. The cross corner effect (Siemers, M. et al., Proc. 51$^{st}$ SVC Tech. Conf., 2008, 43-48) with diagonally symmetrical inhomogeneities is known, for example. There is likewise such an effect with cylindrical magnetrons.

An asymmetrical magnet system is described in US 2011/0127157 that can be used for cylindrical single or dual magnetrons. The plasma is pulled more between the cathodes due to the asymmetrical design, with the electrons being able to move better to the respective anodes and with a smaller impedance being produced.

Starting from this, it was the object of the present invention to provide a device that ensures a high and more stable uniformity of the layers and in so doing parasitic deposits are simultaneously avoided to increase the production time of the device. It is, however, also equally the object of the present invention for layers to be set more exactly with a targeted inhomogeneity and also with steeper layer thickness gradients.

This object is achieved by the device and method described herein, and the advantageous developments thereof.

In accordance with the invention, a device is provided for depositing uniform layers on rotationally moved substrates by means of magnetron sputtering that includes the following components:

a) a vacuum chamber;
b) at least one inlet for a sputtering gas;
c) a turntable with at least one substrate holder; and
d) at least one lighting source consisting of a linearly extended dual magnetron source and the dual magnetron source consists of two linear magnetron electrodes, with the coating source having an inhomogeneous plasma density that enables an inhomogeneous removal rate.

The heart of the present invention is based on inhomogeneous, i.e., locally different, plasma densities being present in the coating source that make it possible to achieve an inhomogeneous removal rate.

The locally different plasma densities are effected by a suitable spatially distributed electron density distribution at the magnetron cathodes. The distribution is here controlled both in the longitudinal direction, i.e., along the target axis of the magnetron, and in the vertical direction, i.e., in the direction from the target plane toward the substrate plane.

It is hereby made possible to produce layers of high and stable uniformity on the substrate.

It can be achieved by an opposite arrangement of the magnet configuration that the gradient of the plasma density is reversed. This has the effect that the plasma density does not increase outwardly, but inwardly. This effects an amplification of the inhomogeneous removal rate so that layers having a targeted inhomogeneity can also be produced more exactly. A steeper layer thickness gradient can thus be produced.

It is preferred in accordance with the invention that the magnetron electrodes have an inhomogeneous magnetic field and/or the magnetron electrodes have a substantially asymmetrically poled magnet configuration and/or the coating source has a generator with a settable pulse shape and/or pulse frequency.

The present invention relates to a new configuration of the magnets for linear magnetron electrodes and for magnetron electrodes arranged asymmetrically to one another by which a coating having a very high and stabile uniformity can be achieved with substrates to be coated in a rotating manner (turntable arrangement). The asymmetry is achieved in that the magnet configuration of the adjacent magnetron electrodes are differently designed or/and poled.

A variant in accordance with the invention provides that the magnets in the sputtering device are not poled symmetrically, but rather asymmetrically. One magnetron thus has the polarity N-S-N and the adjacent magnetron has the polarity S-N-S.

By swapping over the arrangement of the differently poled magnetron electrodes (right magnetron to the left, left magnetron to the right), the gradient can be designed in the opposite direction so that an amplification of the layer gradients is possible.

Unlike the methods known from the prior art (e.g., DE 10 2013 207 771 A1), not only the coupling between the magnetrons is increased in the case in accordance with the invention, but the layer thickness distribution on the substrate is also changed.

While in accordance with DE 10 2013 207 771 A1 only a linear tilt of the distribution is made possible, in accordance with the invention a 1/r dependency of the layer thickness distribution can be implemented, where r is the distance of the point to be measured on the substrate from the rotation center.

The proposed configuration is also advantageous because it makes is possible to again reduce the impedance of the discharge. This is favorable for materials that deliver a high impedance such as silicon or for materials with poor conductivity. However, a small discharge voltage is also favorable with other materials such as tantalum, niobium that either include metallic targets or targets that include metallic portions because this reduces the susceptibility to arc discharges. They generally result in particles.

The configuration is also particularly advantageous in processes such as the metamode process where work is performed without a reactive gas in the region of the sputtering sources. Reactive gas frequently reduces the discharge voltage. This configuration is also favorable for a process such as is proposed in DE 10 2013 221 029 A1 in which sputtering targets with ceramic portions are proposed; however, work is otherwise performed without oxygen in the sputtering region.

The configuration is furthermore advantageous because it makes it possible to keep the plasma closer to the target. The interaction between the plasma and the substrate can thus be reduced while simultaneously very dense layers of high quality can be presented in that the distance between the target and the substrate does not become too large. Interactions between the plasma and the substrate can become noticeable, for example, by increased particle load or by inhomogeneities in the layer thickness (picture frame effect).

The locally different plasma density and thus uniformity can be further influenced by a special pulse pattern, pulse frequency, but also by gas pressure. At least one gas flow regulator is preferably used for the setting of the gas pressure here.

It is preferred that the inhomogeneous removal rate increases, preferably linearly, from the turntable center to the turntable margin and is particularly preferably proportional to the distance from the turntable center. A largely homogeneous coating hereby results on the substrate without the use of additional correction masks.

The device preferably has at least one plasma source. This plasma source is then preferably used for the pretreatment of the substrate surface and/or for the modification of the structure and/or of the stoichiometry of the layer.

The turntable of the device in the process can rotate at a speed of 1-500 r.p.m., preferably 150-300 r.p.m. A fast rotation of the turntable in the range from 150-300 r.p.m. can be advantageous for a high throughput and a high precision. A time constant of around 500 μs up to some milliseconds can be realized by the high rotation speeds.

The at least one dual magnetron source preferably consists of magnetron electrodes of a cylindrical or planar source material and of a holder for this material and a target belonging thereto. The at least two magnetron electrodes can here be electrically operated by means of bipolar pulsing. In this respect, sinusoidal pulses or also rectangular pulses are used, with the frequency also being able to be varied. The sputtering frequency can be varied here in a range from a few kHz up to a plurality of 100 kHz. Frequencies are preferably used between 10 kHz and 100 kHz, particularly preferably 20-60 kHz.

The magnetron sputtering sources can be used in a sputter down or also in a sputter up arrangement.

The at least one magnetron electrode preferably has one target that comprises or consists of at least one of the following components:
a) ceramic material or material mixtures;
b) thermally injected material or material mixtures;
c) sintered material or material mixtures;
d) crystalline material;
e) metallic material or material mixtures; and/or
f) a material containing an oxide; or
g) mixtures thereof.

The magnetron electrode preferably consists of a metal/semiconductor or comprises a target comprising or consisting of ceramic material.

There are often compressive strains with high quality optical coatings. They are of high significance since they can result in deflections in the optics or also in a detachment of the layer or even in a break of the substrate. In accordance with the invention, the discharge voltage of the plasma can be reduced, which can result in a reduction of the layer voltage.

The magnetron electrode can include a target. This can consist of a metal or of silicon or can also comprise or consist of a material containing oxide. Materials containing oxide have the advantage that they provide an oxygen source. Extra oxygen is sometimes required in the sputtering area; for example, because the oxygen of the plasma source is not sufficient for oxidation or because higher coating rates are to be achieved. It is favorable in this case to take the oxygen directly from the target, i.e., from the magnetron electrode, because a higher stability thus results in comparison with a target of metal and with oxygen as the reactive gas. For normally, the reactive coating of a metallic (or silicon) target using reacting gas results in a rate instability if the oxygen partial pressure is not kept precisely constant since the rate of a metallic target can be considerably different from the rate of the corresponding oxide. If the reactive gas (oxygen, nitrogen) is contained in the target, the rate is independent of the covering with an oxide layer.

Preferred materials containing oxide are TiOx, TaOx, NbOx, ZrOx, ZrOx:Y, CeOx, ScOx, HfOx, AlOx, SiOx, ZnOx, InSnOx and/or SnOx, where x is particularly preferably selected such that the target still just has conductivity, but x is simultaneously close to stoichiometry.

The invention can also be advantageous for the manufacture of layers on an Si base that in part contain hydrogen. Bandpass filters can thus be manufactured for the near infrared range. Very thin substrates that bend a lot are frequently used there. The layer voltage can also be reduced there in accordance with the invention.

The distance of the at least one substrate from the at least one magnetron electrode preferably amounts to 5 to 30 cm, preferentially 5 to 20 cm, particularly preferably 6 to 15 cm, and very particularly preferably 6 to 12 cm. A small distance is favorable because it makes it possible to manufacture layers with high density. However, a very small distance is unfavorable because it can make the increased formation of particles possible. They can be electrically captured in the plasma and the substrate running through can thus act as a dust catcher.

In accordance with the invention, there is also the possibility with the device of substantially increasing the distance between the electrodes and the magnetron without this causing any losses in the layer properties. Very dense and smooth as well as absorption-free layers are required in the desired applications for which purpose high particle energies are required as a rule. The process pressure furthermore has to be as small as possible so that no impacts of the sputtered particles on one another occur on the way from the target to the substrate. This can be achieved in that the process pressure in the sputtering chamber can be lowered to a value of less than $1 \times 10^{-3}$ mbar. This is possible in the method in accordance with the invention because the plasma density is considerably higher in the region of the electrodes. Magnetrons are typically operated at a pressure of some $1 \times 10^{-3}$ mbar ($3 \times 10^{-3}$ mbar to $6 \times 10^{-3}$ mbar). A pressure variation has the effect of a surface roughness in a high quality optical coating. It can be measured using an AFM (atomic force microscope).

The roughness can also be set via the pressure with the plasma source.

An $SiO_2$ layer of 2 μm thus, for example, has a roughness higher by 0.9 mm in comparison with the substrate if it is manufactured at a pressure at the magnetrons of $6 \times 10^{-6}$ mbar. If the pressure is reduced to less than $3 \times 10^{-6}$ mbar, the additional roughness in comparison with the substrate falls to less than 0.1 nm when the distance between the source and the substrate is approximately 7 cm large. However, there is the problem in the methods in accordance with the prior art that the target voltage increases as the pressure falls and thus the tendency to arcing increases.

Similar phenomena can also be observed with a tantalum pentoxide layer. The additional roughness of a 2 μm thick $Ta_2O_5$ layer is here reduced to 0.1 nm over 0.2 nm or more if the pressure is reduced.

At a pressure of $1 \times 10^{-3}$ mbar, as is possible in accordance with the invention, the distance can be tripled without an additional roughness of the layer with respect to the layer occurring.

The distance can be considerably increased to 15 cm or 20 cm or more due to the lower process pressure of $1 \times 10^{-3}$ mbar. Alternatively, with a smaller distance and a pressure of $3 \times 10^{-3}$ mbar, the target voltage and thus the arcing tendency is reduced.

The advantage of the invention is that a high particle freedom can be implemented with a relatively small distance because the plasma can be pulled very closely to the target. The distance can even be further increased by a pressure reduction without there being any compromises in the density of the layers.

A setting can take place via the geometry. Since the reduction in the sputtering rate reduces proportionally to the inverse value of the radius outwardly, the gradient on the substrate can be set via a suitable geometry with a given gradient of the sputter rate over the dual magnetron. If the radius for the substrate movement is increased, the relative reduction of the rate toward the outside is smaller and vice versa.

The advantage of this spacing is that a homogeneous coating of small components is made possible with a high density and a high precision. The precision of the coating process falls with higher spacings from the magnetron electrode to the substrate. The distance between the turntable and the walls of the magnetron sputtering device preferably amounts to 0.1 to 5 mm. This spacing has proved to be particularly favorable to design the magnetron sputtering device as gas-tight, i.e., to ensure an effective gas compartment separation within the apparatus.

The dual magnetron arrangement in accordance with the invention has the advantage that more source material can be deposited per time which the substrate dwells in the magnetron sputtering device in comparison with a single magnetron arrangement. The consequence is a substantially higher efficiency of the sputtering process. Furthermore, better long-term stabilities can be ensured by the use of dual magnetron arrangements with a bipolar excitation due to the "non-disappearing anode" and higher plasma densities in combination with denser (but also more stressed) layers.

In accordance with the invention, polymer substrates can be coated more favorably because the temperature of the discharge can be reduced due to the smaller discharge voltage and/or the greater distance.

The polymer coating can likewise be designed more favorably in accordance with the invention since the temperature introduction into the layer is also reduced as the discharge voltage falls.

The device can consequently advantageously have a device to produce mid-frequency discharges.

In a further preferred embodiment, the apparatus comprises two, optionally also three, magnetron sputtering devices. The advantage of such embodiments above all results with multilayer coatings, i.e., on the coating of a substrate with a plurality of different layers. In this case, stacks of two layer types which comprise different material (source material) can be generated with two magnetron sputtering devices. Consequently, the possibility is given in the case of three magnetron sputtering devices of sputtering stacks of three kinds of layers onto the substrate which layers comprise different material. Furthermore, material mixtures of the respective source materials can also be produced, i.e., mixed layers can be deposited. The use of two magnetron sputtering devices for optimizing the layer properties is in particular very advantageous in the area of very complex optical multilayer filters having more than 100 single layers. Depending on the demands (e.g., special design), three or more magnetron sputtering devices can also prove advantageous.

It is further preferred that rectangular or sinusoidal pulses are used as the pulse shape, particularly preferably at a frequency of 40 kHz. This results in a greater inhomogeneity of the plasma along the target axis. There is thus the option of again influencing the distribution itself by setting the pulse shape and the frequency. This has the consequence that the correction aperture (shaper aperture) is no longer necessary. There is alternatively also the possibility that the correction aperture received substantially less coating material. In a standard embodiment, the layer thickness gradient is approximately 30% at a distance of the substrate center of 60 cm from the center of the turntable and with a substrate diameter of 200 mm. The screen therefore has to keep out 30% more layer at the inner margin of the substrate than at the outside. The layer thickness correction then runs over 30%. At the same time, the screen receives approximately eight times the rate that reaches the substrate. The advantage of the invention is that the screen only has to correct a few % because an already almost homogeneous coating is achieved on the substrate. The screen thereby receives a great deal less layer than in the standard configuration and can be used a lot longer. At the same time, the distribution can also be set very much more exactly since only a few % of the layer distribution has to be corrected. Since the screen also receives a great deal less layer, the drift of the distribution in the course of the coating is also smaller.

There is thus the option of also setting the distribution substantially more exactly. Whereas in a normal geometry the layer rate increases from the outside to the inside in accordance with the dependency 1/r, the increase can be considerably reduced in accordance with the invention. This also makes it possible to considerably increase the service life of the system (cleaning). The plasma impedance can also be reduced in the most favorable scenario to this extent. This is generally of advantage for the cleanliness of the coating because the tendency to arc discharges and thus the formation of particles are reduced.

The invention can also be used to generate a greater gradient. In this respect, the already present layer thickness gradient can again be increased by a screen without very sharp structures and edges being necessary at the mask.

Depending on the magnet design, the plasma can project differently far into space. The substrate can thus be located either inside or outside the plasma, with the transition being fluid. It is favorable with respect to a small particle load that the substrate is outside the plasma since particles are often held in the proximity of electrical fields. On the other hand, a small distance between the target and the substrate is also desired due to the better layer properties. The magnet design in accordance with the invention makes it possible to build up the plasma closely to the target.

This has further advantages for a good distribution of the layer thickness on the running substrate in the direction of running. If there are namely fluctuations of the plasma density on the substrate running through the plasma, deviations from the uniformity occur along the direction of running. This can arise if electrons see either a metallic surface (of the turntable) or an insulating surface (of the substrate). Electrons would be removed at the conductive surface so that less plasma can be produced there and the plasma density is reduced there. This also has an effect on the sputtering rate because fewer electrons are present in the plasma at specific points in time. The effect is similar to that of the so-called picture frame effect (described in US 2007/0227882 A1). Pressure surges in the reactive gas at the start and end of the glass panes there result in rate changes in inline systems so that a different layer thickness is present at the ends of the glass panes. However, the two effects have different causes.

The magnetron sputtering device can have an effective gas compartment separation for gases within the vacuum of 1:25; 1:100 is better. An effective gas compartment separation between the coating stations of 1:100 makes possible the production of clearly defined co-sputtered materials. The reason for this is that noble gas and/or reactive gas of a magnetron sputtering device is prevented from moving into a further magnetron sputtering device of the same device. In addition, the quantity of noble gas and/or reactive gas can be set more precisely to a specific predefined value and/or be kept constant by the effective gas compartment separation.

Plasmas on a magnetron discharge basis as a rule comprise more than 99% non-ionized particles. They can have high energies and therefore make a high contribution to layer stresses. They can be indirectly influenced, for example, by changing the magnetic field design or by the use of alternative sputtering gases. In accordance with the invention, the sputtering gas can comprise or consist of a noble gas. Preferred noble gases are argon, neon, xeon and krypton. Noble gas mixtures are also possible. In accordance with the invention, the reactive gas can comprise or consist of an oxidizing gas. Oxygen, nitrogen, tetrafluoromethane, octafluorocyclobutane, carbon dioxide and hydrogen fluoride are preferred reactive gases. Mixtures of these gases can also be used.

Hydrogen can also be used.

The device preferably contains a photometer. It is thereby made possible to photometrically monitor the thickness of the layer on the substrate during the sputtering process. For this purpose, a fast broadband measurement (e.g., of 200-2000 nm) of the transmission or of the reflection can be carried out. The layer thickness can be determined and monitored by a comparison with the spectrum theoretically to be expected. In some cases, a quartz crystal can additionally also be used, for example with cavity filters in which only a small signal change of the transmission is expected with certain layers.

In a further preferred embodiment of the device, the substrate holder comprises or consists of polyetheretherketone. The use of polyetheretherketone has the advantage that the particle formation is reduced.

It is further preferred that the device has a regulation system for regulating and/or stabilizing the reactive gas in the magnetron sputtering device.

The advantage of this regulation is that no dielectric layer is removed from the target in the method in accordance with the invention, but the target is rather not covered by a dielectric layer at any time. This can be realized, for example, in that metallic targets are operated in the so-called "transition mode." The cylindrical source material (target) is here permanently in a metallic, oxide-free state due to a suitable regulation of the generator, while sufficient oxygen for the oxidation of the growing layer is present in the process space. The above-named control variables are as a rule realized on the oxygen partial pressure or the voltage of the generator or of the target. The deposition of stoichiometric layers can thus be achieved at a high deposition rate in the process, while the interfering influence of particles is minimized, i.e., a very low number of particles is achieved.

In accordance with the invention, a method of depositing uniform layers on rotationally moved substrates by means of magnetron sputtering is also provided in which
  a) at least one substrate is arranged on a turntable in a vacuum chamber to enable a coating on a rotational movement of the substrate; and
  b) at least one layer is deposited on the at least one substrate using at least one coating source comprising a linearly extended dual magnetron source, with the layers of source material of the magnetron electrodes being formed by sputter gas.

The coating source in accordance with the invention used here enables an inhomogeneous plasma density that comprises an inhomogeneous removal rate of the source material.

It is preferred in accordance with the invention that the magnetron electrodes have an inhomogeneous magnetic field and/or the magnetron electrodes have a substantially asymmetrically poled magnet configuration and/or the coating source has a generator with a settable pulse shape and/or pulse frequency.

It is preferred that the inhomogeneous removal rate increases, preferably linearly, from the turntable center to the turntable margin and is particularly preferably proportional to the distance from the turntable center. A largely homogeneous coating hereby results on the substrate without the use of additional correction masks.

It is preferred here that at least one plasma source is used in the method in accordance with the invention, with the at least one plasma source preferably pretreating the surface of the substrate via plasma effect and/or the at least one plasma source preferably modifying the structure and/or the stoichiometry of the layer via plasma effect.

A noble gas, in particular argon, is preferably used as the sputtering gas.

In addition to the sputtering gas, at least one reactive gas can preferably be used, in particular selected from the group comprising oxygen, nitrogen, hydrogen carbon dioxide, hydrogen fluoride, tetrafluoromethane, octafluorocyclobutane, and mixtures thereof.

A preferred variant provides that the thickness of the layer on the substrate is monitored by at least one of the measures a) to e) for a process control:
  a) optical transmission monitoring;
  b) optical reflection monitoring;
  c) optical absorption monitoring;
  d) monowavelength ellipsometry or spectral ellipsometry; and/or
  e) crystal quartz measurement.

The device in accordance with the invention is preferably used for the performance of the method.

BRIEF DESCRIPTION OF THE DRAWINGS

The subject matter in accordance with the invention will be explained in more detail with reference to the following Figures and examples without intending to restrict it to the specific embodiments shown here.

DETAILED DESCRIPTION OF THE INVENTION

Figure 1:
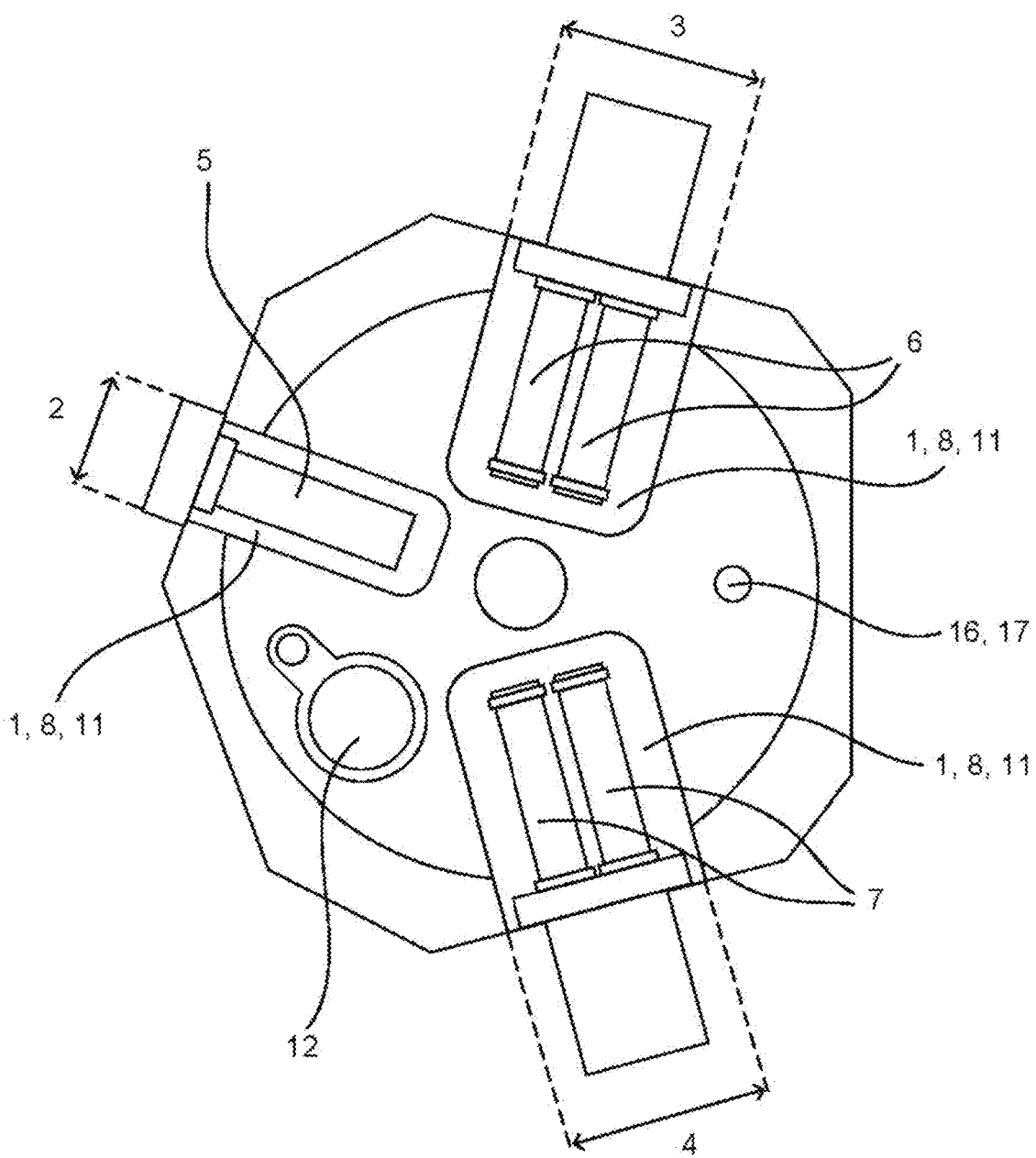
FIG. 1 shows a device in accordance with the invention without a turntable in a plan view.

FIG. 1 schematically shows a preferred device in accordance with the invention without a turntable in a plan view. The device has three magnetron sputtering devices 2, 3, 4, of which one is designed in the single magnetron arrangement 2 and two in the dual magnetron arrangement 3, 4. The magnetron sputtering device 2 comprises a magnetron electrode 5, sputtering gas 11 and optionally reactive gas 8 and is in a vacuum 1. The magnetron sputtering devices 3, 4 each comprise two magnetron electrodes 6, 7, sputtering gas 11, and optionally reactive gas 8 and are in a vacuum 1. A plasma source 12 and a photometer 16 and/or an ellipsometry flange 17 are located in the vicinity of the magnetron sputtering devices 2, 3, 4.

Figure 2:
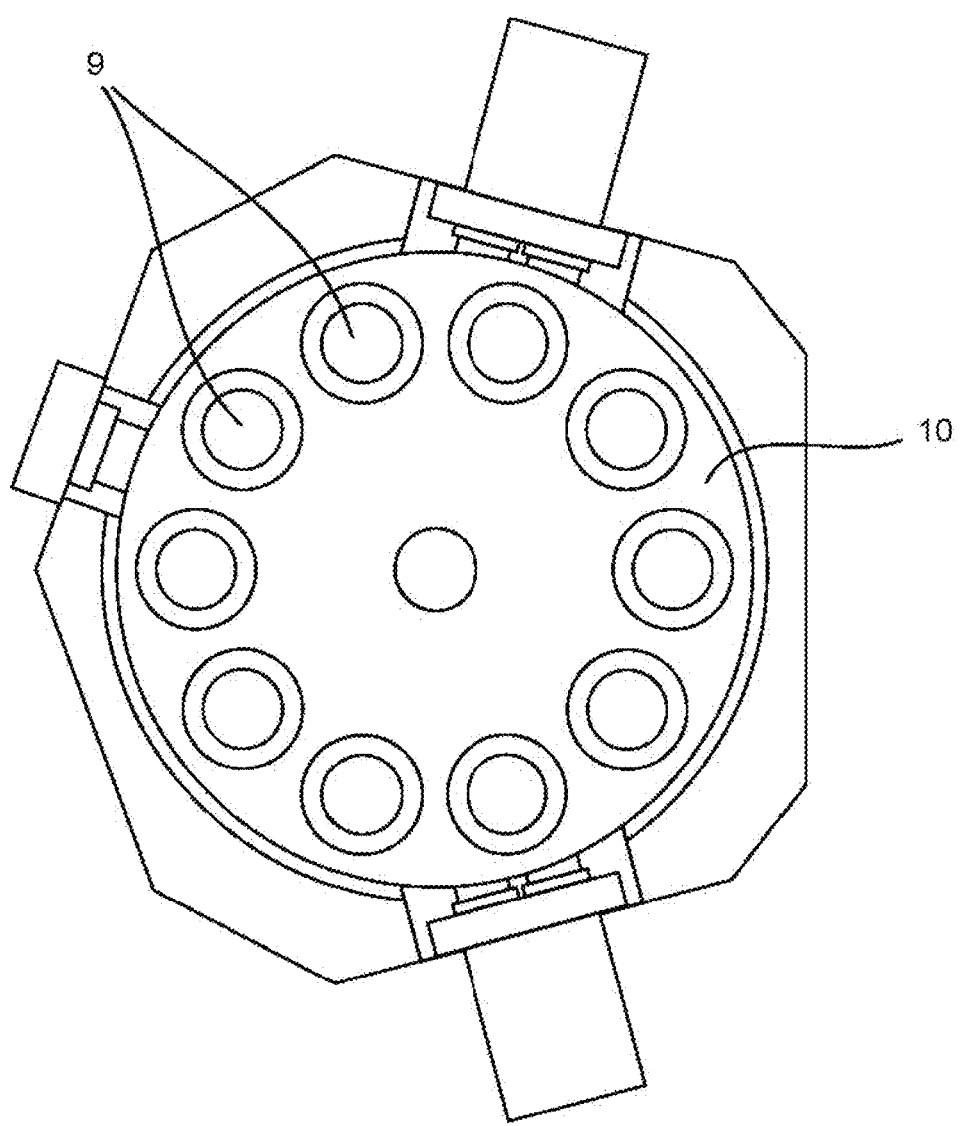
FIG. 2 shows a device in accordance with the invention with a turntable in a plan view.

FIG. 2 schematically shows a preferred embodiment of the turntable in a plan view. The turntable 10 is located in the apparatus and in this example has ten identical substrate holders 9.

Figure 3:
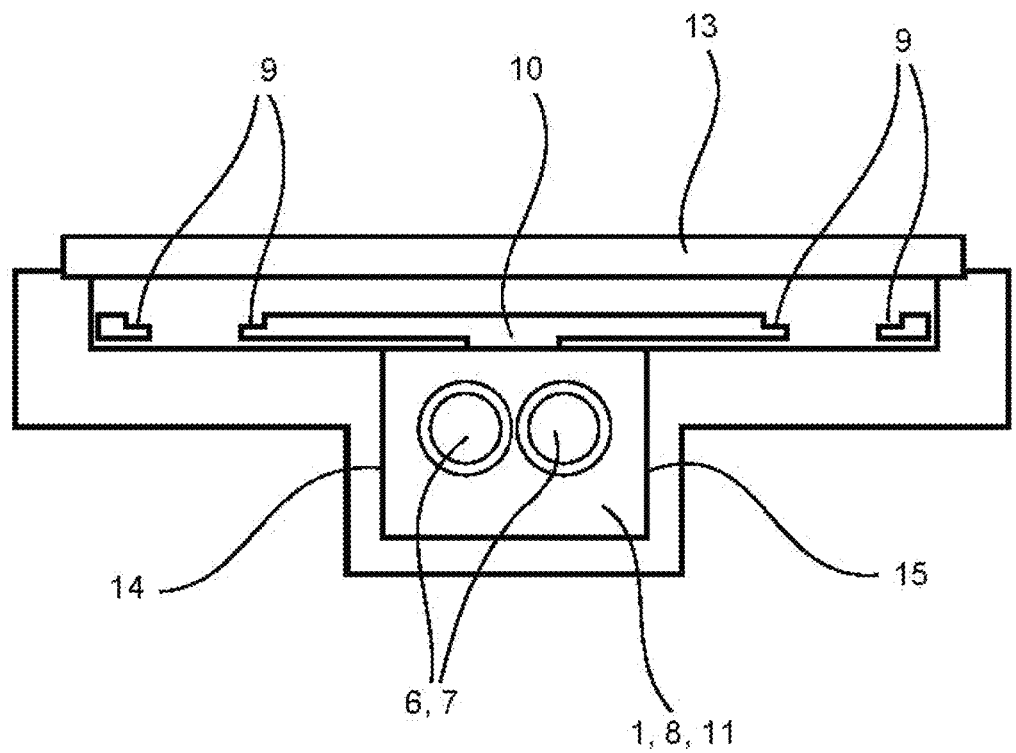
FIG. 3 shows a device in accordance with the invention in a sectional representation.

FIG. 3 schematically shows a preferred embodiment of the device with a turntable 10 in a side view. The cross-section of a magnetron sputtering device is visible which comprises two cylinders of source material 6, 7 (dual magnetron arrangement). The magnetron sputtering device is delineated in a gas-tight manner from the rest of the device at the sides of boundary walls 14, 15 and at the top by the turntable 10; it comprises sputtering gas 11, optionally reactive gas 8 and is in a vacuum 1. Two substrate holders 9 of the turntable 10 are shown or visible in the cross-section. A cover 13 is located above the turntable 10 and has boundary walls which are located to the side of the turntable 10 that close the device in a gas-tight manner.

Figure 4:
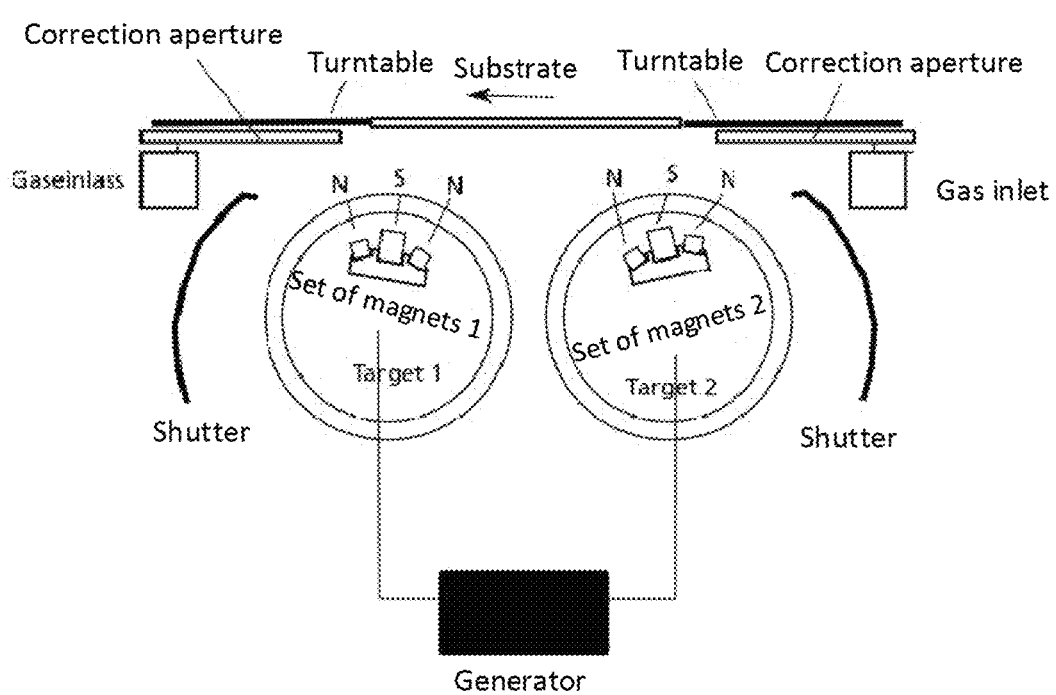
FIG. 4 shows a device in accordance with the prior art with symmetrical polarity.

A sputtering device in accordance with the prior art is shown in FIG. 4 that has a cylindrical dual magnetron arrangement with symmetrical polarity.

The generator supplies the sources with voltage pulsed in a bipolar manner, with the pulses being able to have sinusoidal, rectangular, or also other pulse patterns.

Figure 5:
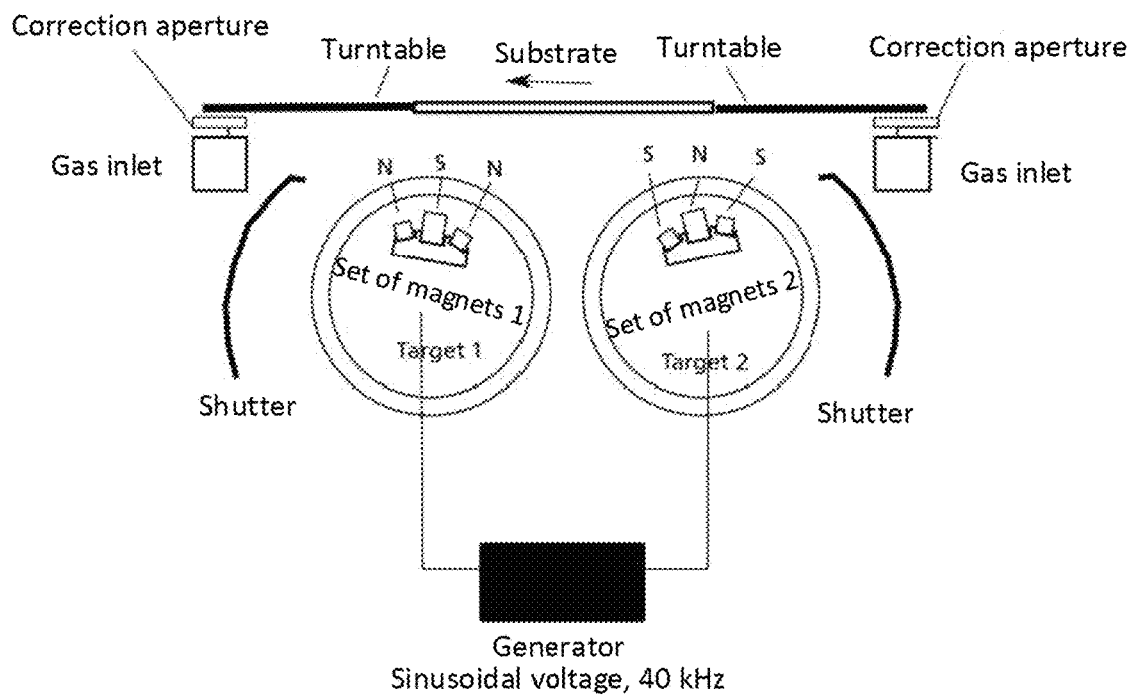
FIG. 5 shows a device in accordance with the invention with asymmetrical polarity.

A sputtering device in accordance with the invention is shown in FIG. 5 that has a cylindrical dual magnetron with asymmetrical polarity. The generator supplies the sources in this example with voltage that is pulsed in a bipolar manner, with the pulses being sinusoidal. The correction aperture is here largely removed from the coating region.

The cylindrical dual magnetron arrangement shown in FIG. 5 was examined by means of particle-in-cell plasma simulation.

The simulation parameters are compiled in the following:
Model dimensions: 800×600×400 mm$^2$
Cell number: 100×150×100
Time step: 5e-11 s
Time interval: 250 µs
Length, cyl. targets: 513 mm
Target diameter: 138 mm
Excitation frequency: 40 kHz
Modeled power: 1 W (temporal average)
Max. voltage difference: 1000 V
Secondary electron yield: 12%
Electron capture at the target: 100%
Magnetic remanence: 1.4 T
Magnetic susceptibility: 1.05
Susceptibility of the yoke: 1000
Magnetic tilt: ±6° to the inside The electrical feed into the two cylindrical targets takes place in a bipolar manner. In this respect, the voltage difference between the targets is predefined; the potential difference from the mass (=chamber wall) results automatically during the simulation with reference to the reception of positive and negative charges. The targets are periodically reversed in polarity in the form of a sinusoidal signal; the excitation frequency amounts to 40 kHz.

A model of a commercial set of magnets for cylindrical targets is first assumed for the magnets. Both sets of magnets are tilted toward the center by 10° in the model. In the standard design, both sets of magnets have the same polarity, i.e., the upper side of the outer magnetic ring to the north pole, the upper side of the inner magnet to the south pole. This configuration will be called "even" in the following. In the case in accordance with the invention, the second set of magnets (at the right hand side in FIG. 5) are reversed in polarity; this configuration will be called "odd" in the following.

Figure 6:
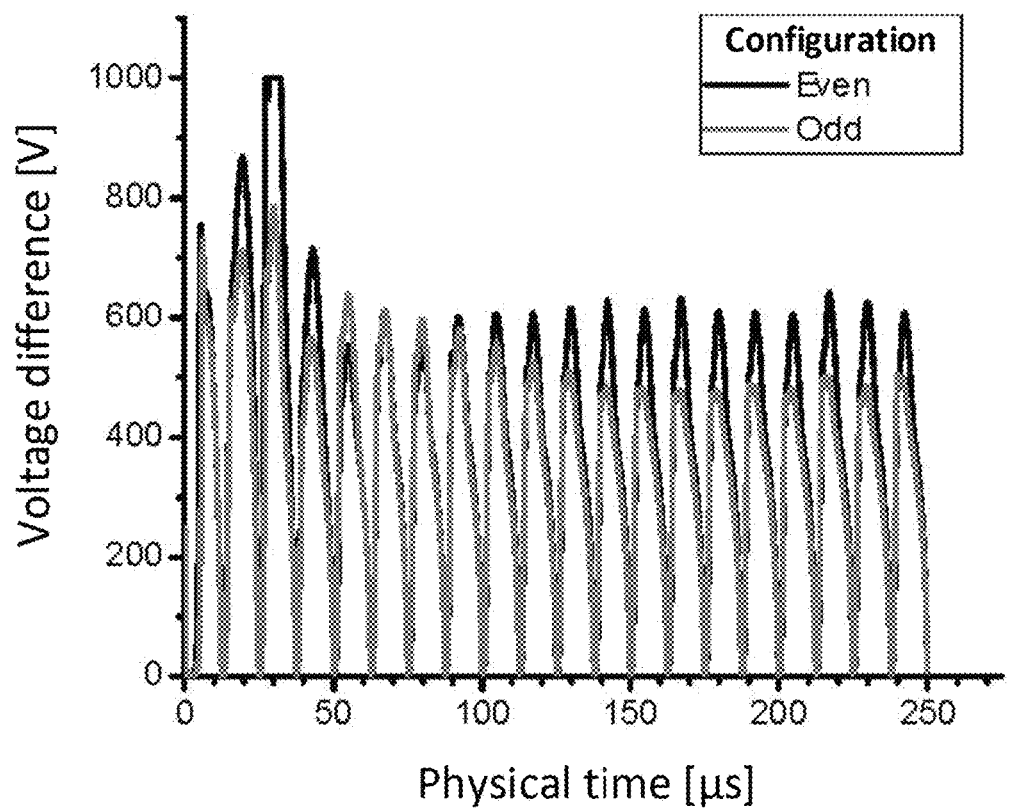
FIG. 6 shows the time dependent voltage difference between the targets with a sinusoidal excitation of 40 kHz in a diagram.
Figure 7:
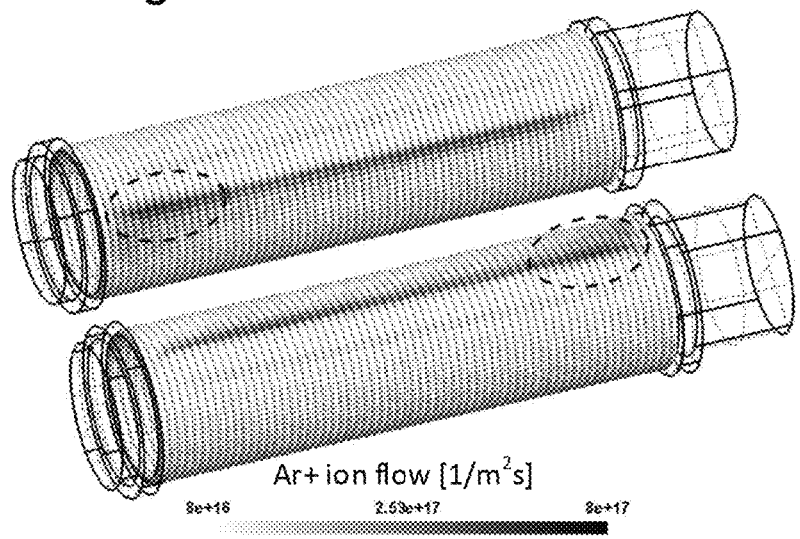
FIG. 7 schematically shows a visualization of the averaged ion flow density on cylindrical targets.
Figure 7:
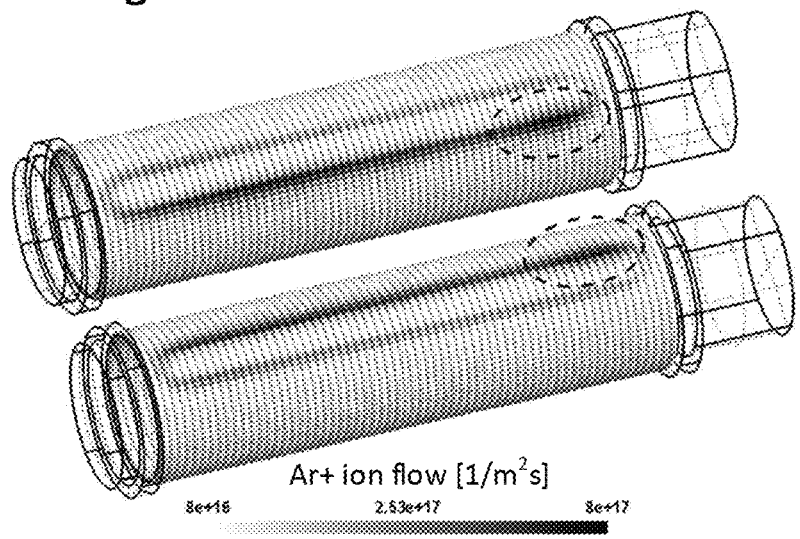
Figure 8:
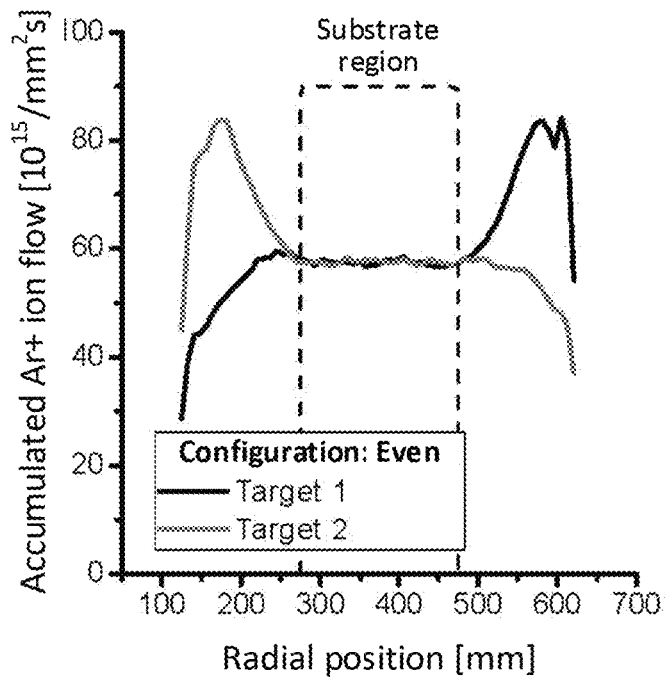
FIG. 8 shows a diagram in which the averaged ion flow density for the configuration "even" is shown over time and target area.

During the simulation, the dissipated plasma power is continuously detected (with reference to the kinetic energy of charged particles before and after a time step) and is respectively accumulated over 0.1 µs. The voltage difference between the targets is regulated by means of a proportional regulator by a comparison of the desired power and the actual power. The resulting time dependent curves of voltage and power can be seen from FIG. 6. It generally takes longer than 50 µs until a quasi-stationary discharge state is assumed. It is furthermore conspicuous that a smaller voltage difference is adopted in balance in the "odd" configuration in accordance with the invention, i.e., the discharge takes place with low impedance. The ion flow profiles on the target for the determination of the sputter erosion distribution are therefore averaged over the last 12 half waves, i.e., in a time interval of 102.5 µs to 250 µs in steps of 2.5 µs. The ion flows in a three-dimensional view are shown in FIG. 7. The ion flow density accumulated from the ion flows at the targets shows a diagonally symmetrical distribution for the "even" configuration (see FIG. 8) and a unilateral distribution for the "odd" configuration (see FIG. 9).

Figure 9:
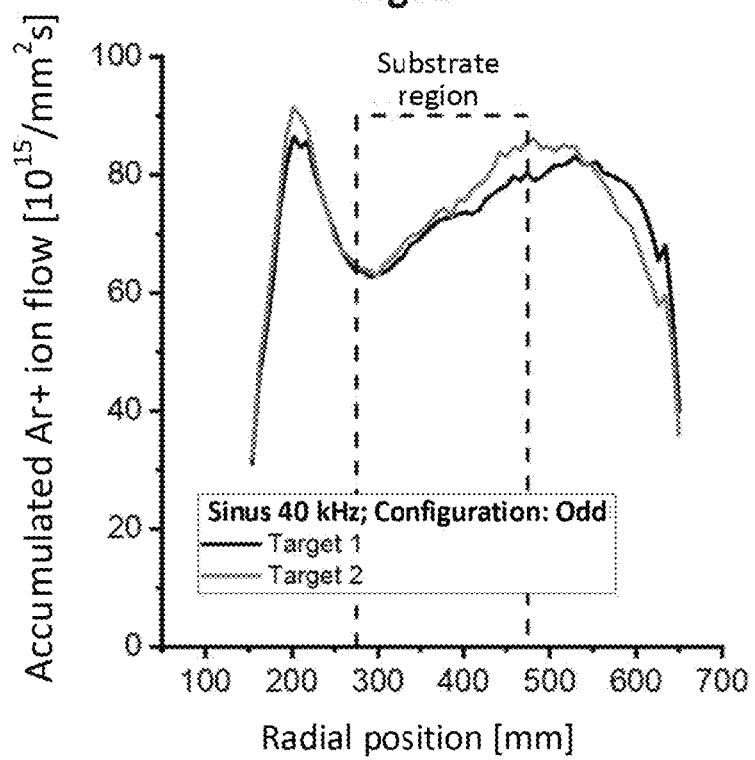
FIG. 9 shows a diagram in which the averaged ion flow density for the configuration "odd" is shown over time and target area.

It can furthermore be seen that the absolute value of the flow density is higher in the "odd" configuration, which is associated with the already mentioned lower plasma impedance. A lower plasma impedance is advantageous as long as the voltage for the sputtering effect is sufficient because generally the tendency to unwanted discharges (arcs) is reduced. The higher ion flow density in FIG. 9 is also advantageous because it results in a higher rate.

Figure 10:
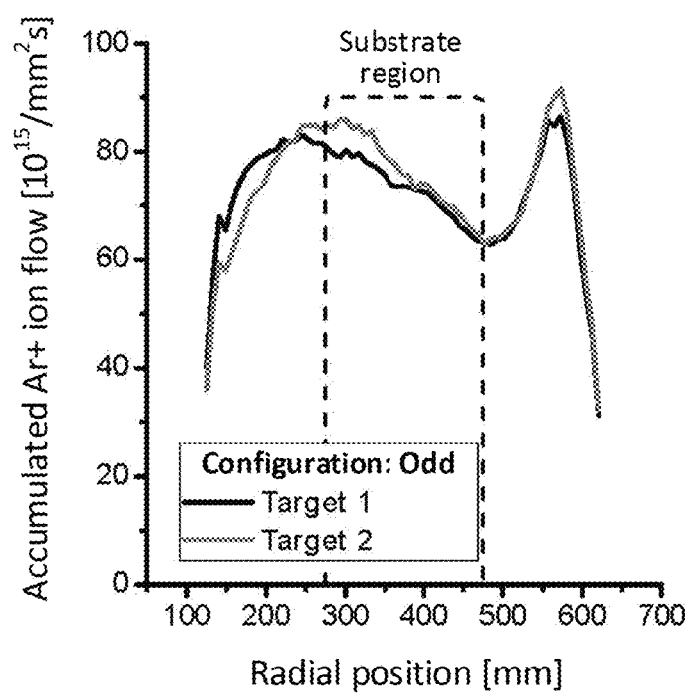
FIG. 10 shows the comparison of the emission profiles for argon ions in accordance with the method in accordance with the invention and the method in accordance with the prior art in a diagram.

FIG. 10 shows the cumulative ion flow density at the target in a second arrangement. In this respect, the gradient of the ion flow density is reversed so that a small removal rate toward the outside results. With a further distribution mask, it is thus possible to produce a greater layer thickness gradient.

Figure 11:
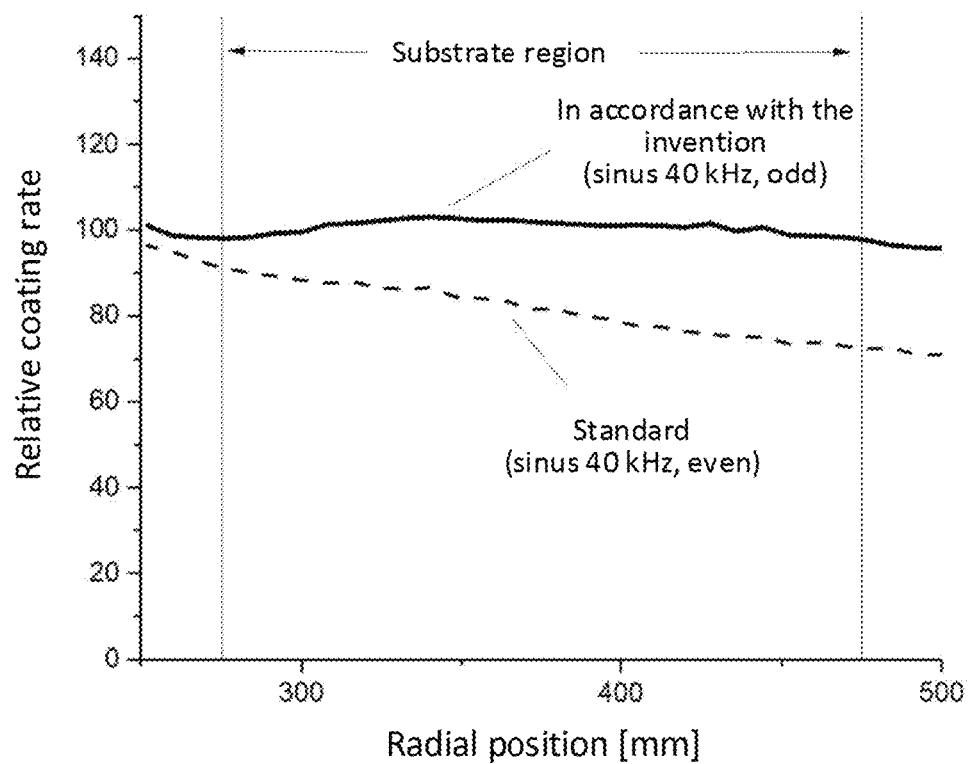
FIG. 11 shows the comparison of the coating rate resulting on the substrate without a separate uniformity screen in accordance with the invention and in accordance with the prior art.

Since the targets rotate during the coating and the substrates rotate on the turntable over both targets, the ion flow profile averaged over the target area is decisive both for the erosion profile on the target and for the layer thickness distribution. With an approximately constant energy distribution of the Ar ions on the target, the ion flow profile is proportional to the sputtering rate. This is shown in FIG. 11 for a time average interval of 100-250 µs, i.e., over 12 half cycles of the sinusoidal excitation.

It can be recognized for the "even" arrangement that an incident coating rate results in the region of the substrates. This region comprises the radial position 270 to 470 mm (substrate diameter 200 mm). With a mask, the rate inwardly then has to be set to the inside to the minimal value of 70 (relative rate).

In the "odd" arrangement, an approximately smooth, homogeneous layer thickness profile results on the substrates in contrast, even without a uniformity mask. With a correct arrangement of the magnet polarity, the reduction of the layer thickness can thus be approximately compensated by the "odd" configuration over the turntable radius. Only a small portion of the coating flow toward the substrate thus to be screened and a higher coating rate results with the same sputtering power.

The invention claimed is:

1. A method of depositing uniform layers on a rotationally moved substrate by magnetron sputtering, in which
   a) at least one substrate is arranged on a turntable in a vacuum chamber to enable a coating on a rotational movement of the substrate; and
   b) at least one layer is deposited on the at least one substrate by utilizing at least one coating source comprising a linearly extended dual magnetron source, with the layers of source material of the magnetron electrodes being formed by sputter gas,
   wherein the magnetron electrodes have a substantially asymmetrically poled magnet configuration; and wherein one of the magnetron electrodes has a polarity N-S-N and the other magnetron electrode has a polarity S-N-S;
   wherein the at least one coating source has an inhomogeneous plasma density that effects an inhomogeneous removal rate of the source material, and the at least one coating source has a generator with a settable pulse shape and pulse frequency in a frequency range of 20-60 kHz to control thickness of the layer, and wherein the settable pulse shape comprises sinusoidal pulses; and
   wherein the deposition of layers is not mediated by one or more correction masks to assist in the production of uniform distribution of the deposited layers.

2. The method according to claim 1, wherein the magnetron electrodes have an inhomogeneous magnetic field.

3. The method according to claim 1, wherein the inhomogeneous removal rate increases from the turntable center to the turntable margin.

4. The method according to claim 1, which includes pretreating the surface of the substrate with a plasma source or modifying the structure and/or the stoichiometry of the layer via plasma effect.

5. The method according to claim 1, which utilizes a noble gas as the sputtering gas.

6. The method according to claim 5, wherein the sputtering gas is argon.

7. The method according to claim 5, which utilizes at least one reactive gas in addition to the sputtering gas.

8. The method according to claim 7, wherein the at least one reactive gas is selected from the group consisting of oxygen, nitrogen, hydrogen, carbon dioxide, forming gas, hydrogen fluoride, acetylene, tetrafluoromethane, and octafluorocyclobutane.

9. The method according to claim 1, wherein the thickness of the layer on the substrate is monitored by at least one of the measures a) to f) for a process control:
   a) time control;
   b) optical transmission monitoring;
   c) optical reflection monitoring;
   d) optical absorption monitoring;
   e) monowavelength ellipsometry or spectral ellipsometry; and/or
   f) crystal quartz measurement.

10. The method according to claim 1, which utilizes a device for depositing uniform layers on rotationally moved substrates by magnetron sputtering comprising
    a) a vacuum chamber;
    b) at least one inlet for a sputtering gas;
    c) a turntable with at least one substrate holder; and
    d) at least one coating source consisting of a linearly extended dual magnetron source and the dual magnetron source consists of two linear magnetron electrodes, with the coating source having an inhomogeneous plasma density that enables an inhomogeneous removal rate.

* * * * *